US012666817B2

(12) United States Patent
Kang et al.

(10) Patent No.: US 12,666,817 B2
(45) Date of Patent: Jun. 23, 2026

(54) DISPLAY DEVICE WITH HIGH-POTENTIAL VOLTAGE LINK LINES INCLUDING HOLES

(71) Applicant: LG Display Co., Ltd., Seoul (KR)

(72) Inventors: Minji Kang, Seocheon-gu (KR);
SungGyu Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 771 days.

(21) Appl. No.: 17/968,690

(22) Filed: Oct. 18, 2022

(65) Prior Publication Data

US 2023/0200159 A1    Jun. 22, 2023

(30) Foreign Application Priority Data

Dec. 21, 2021    (KR) ........................ 10-2021-0184335

(51) Int. Cl.
*H10K 59/131*    (2023.01)
*G09G 3/3275*    (2016.01)
(52) U.S. Cl.
CPC ......... *H10K 59/131* (2023.02); *G09G 3/3275* (2013.01); *G09G 2300/0426* (2013.01); *G09G 2320/0223* (2013.01)
(58) Field of Classification Search
CPC .... G09G 3/30–3291; G09G 3/00; G09G 3/32; G09G 3/3266; G09G 3/3233;
(Continued)

(56) References Cited

U.S. PATENT DOCUMENTS 9,147,723 B1 *    9/2015    Lee ........................ H10K 71/00
10,170,534 B1 *    1/2019    Kim ........................ H10D 86/60
(Continued)

FOREIGN PATENT DOCUMENTS

CN        105374843 A        3/2016
CN        108831910 A        11/2018
(Continued)

OTHER PUBLICATIONS

Korean Intellectual Property Office, Office Action, Korean Patent Application No. 10-2021-0184335, Nov. 7, 2025, seven pages.
(Continued)

*Primary Examiner* — Chanh D Nguyen
*Assistant Examiner* — Nguyen H Truong
(74) *Attorney, Agent, or Firm* — Fenwick & West LLP

(57)        ABSTRACT
A display device is disclosed that includes a substrate including a display area and a non-display area that at least partially surrounds the display area. The display device further includes a plurality of pixels in the display area. The display device further includes a data drive unit in the non-display area. The display device further includes a plurality of data lines in the display area. The display device further includes a plurality of data link lines disposed in the non-display area that electrically connect together the data drive unit and the plurality of data lines. The display device further includes high-potential voltage link lines in the non-display area that are configured to supply high-potential voltages to the plurality of pixels. The high-potential voltage link lines include a plurality of holes in regions of the high-potential voltage link lines that overlap the plurality of data link lines.

28 Claims, 8 Drawing Sheets

(58) Field of Classification Search

CPC .. G09G 3/3275; G09G 3/3225; G09G 3/3258; G09G 3/3216; G09G 2300/0426; G09G 2320/0223; H10K 59/126; H10K 59/131; H01L 21/28; H01L 25/16; H01L 27/12; H01L 27/15; H01L 27/32; H01L 29/08; H01L 29/786; H01L 33/16; H01L 33/38; H01L 33/62; H01L 51/00; H01L 51/52; H01L 51/56; H05K 1/02; H05K 1/14

See application file for complete search history.

(56) References Cited

U.S. PATENT DOCUMENTS

| | | | | |
|---|---|---|---|---|
| 10,762,838 | B2 | 9/2020 | Kang et al. | |
| 2019/0088198 | A1* | 3/2019 | Kang | G09G 3/3233 |
| 2020/0184871 | A1* | 6/2020 | Hong | G09G 3/3688 |
| 2020/0185428 | A1 | 6/2020 | Um et al. | |
| 2021/0091164 | A1 | 3/2021 | Kim et al. | |
| 2021/0384466 | A1* | 12/2021 | Liu | H10D 86/443 |
| 2022/0013621 | A1* | 1/2022 | Kim | H10K 59/123 |

FOREIGN PATENT DOCUMENTS

| | | |
|---|---|---|
| CN | 111276105 A | 6/2020 |
| CN | 112530992 A | 3/2021 |
| KR | 10-2019-0030906 A | 3/2019 |
| KR | 10-2019-0080281 A | 7/2019 |
| KR | 10-2020-0068439 A | 6/2020 |

OTHER PUBLICATIONS

China National Intellectual Property Administration, Office Action, Chinese Patent Application No. 202211286422.0, Jan. 10, 2026, 11 pages.

\* cited by examiner

DISPLAY DEVICE WITH HIGH-POTENTIAL VOLTAGE LINK LINES INCLUDING HOLES

CROSS-REFERENCE TO RELATED APPLICATION

This application claims the priority of Republic of Korea Patent Application No. 10-2021-0184335 filed on Dec. 21, 2021, in the Korean Intellectual Property Office, which is hereby incorporated by reference in its entirety.

BACKGROUND

Field

The present disclosure relates to a display device, and more particularly, to a display device capable of suppressing deterioration in image quality by uniformizing a resistor-capacitor (RC) delay caused by a deviation in length between a plurality of data link lines.

Description of the Related Art

Recently, display devices, which visually display electrical information signals, are being rapidly developed in accordance with the full-fledged entry into the information era. Various studies are being continuously conducted to develop a variety of display devices which are thin and lightweight, consume low power, and have improved performance.

As the representative display devices, there may be a liquid crystal display device (LCD), a field emission display device (FED), an electrowetting display device (EWD), an organic light-emitting display device (OLED), and the like.

Among the display devices, an electroluminescent display device is a display device including the organic light-emitting display device and refers to a display device that autonomously emits light. Unlike a liquid crystal display device, the electroluminescent display device does not require a separate light source and thus may be manufactured as a lightweight, thin display device. In addition, the electroluminescent display device is advantageous in terms of power consumption because the electroluminescent display device operates at a low voltage. Further, the electroluminescent display device is expected to be adopted in various fields because the electroluminescent display device is also excellent in implementation of colors, response speeds, viewing angles, and contrast ratios (CRs).

SUMMARY

An object to be achieved by the present disclosure is to provide a display device capable of reducing a deviation in RC delay between a plurality of data link lines by adjusting parasitic capacitance between a high-potential voltage link line and the data link line.

Another object to be achieved by the present disclosure is to provide a display device capable of reducing a difference in data load between an outer periphery and a central portion of a substrate.

Objects of the present disclosure are not limited to the above-mentioned objects, and other objects, which are not mentioned above, can be clearly understood by those skilled in the art from the following descriptions.

In one embodiment, a display device comprises: a substrate including a display area and a non-display area that at least partially surrounds the display area; a plurality of pixels in the display area; a data drive unit in the non-display area; a plurality of data lines in the display area; a plurality of data link lines in the non-display area, the plurality of data link lines electrically connecting together the data drive unit and the plurality of data lines; and high-potential voltage link lines in the non-display, the high-potential voltage link lines configured to supply high-potential voltages to the plurality of pixels, wherein the high-potential voltage link lines include a plurality of holes in regions of the high-potential voltage link lines that overlap the plurality of data link lines in the non-display area.

In one embodiment, a display device comprises: a substrate including a display area and a non-display area that at least partially surrounds the display area; a plurality of pixels in the display area; a data drive unit in the non-display area; a plurality of data lines in the display area; a plurality of data link lines in the non-display area, the plurality of data link lines electrically connecting together the data drive unit and the plurality of data lines; and high-potential voltage link lines in the non-display, the high-potential voltage link lines configured to supply high-potential voltages to the plurality of pixels, wherein an area of the high-potential voltage link lines that overlap the plurality of data link lines in the non-display area decreases in a direction from a center of the substrate towards an outer periphery of the substrate as a length of the plurality of data link lines increases from the center of the substrate to the outer periphery of the substrate.

In one embodiment, a display device comprises: a substrate including a display area and a non-display area that at least partially surrounds the display area; a plurality of pixels in the display area; a data drive unit in the non-display area; a plurality of data lines in the display area; a plurality of data link lines in the non-display area including a first data link line and a second data link line that is longer than the first link line, the plurality of data link lines electrically connecting together the data drive unit and the plurality of data lines; and high-potential voltage link lines in the non-display, the high-potential voltage link lines configured to supply high-potential voltages to the plurality of pixels, wherein a first portion of the high-potential voltage link lines that overlap the first link line has an area that is greater than an area of a second portion of the high-potential voltage link lines that overlap the second link line that is longer than the first link line.

Other detailed matters of the exemplary embodiments are included in the detailed description and the drawings.

According to the present disclosure, the proportion of the region in which the plurality of holes is disposed varies depending on the area in which the high-potential voltage link line overlaps the data link line. Therefore, it is possible to reduce the deviation in RC delay between the outer peripheral region and the central region of the substrate.

According to the present disclosure, it is possible to improve the image quality of the display device by reducing the deviation in RC delay between the plurality of data link lines.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
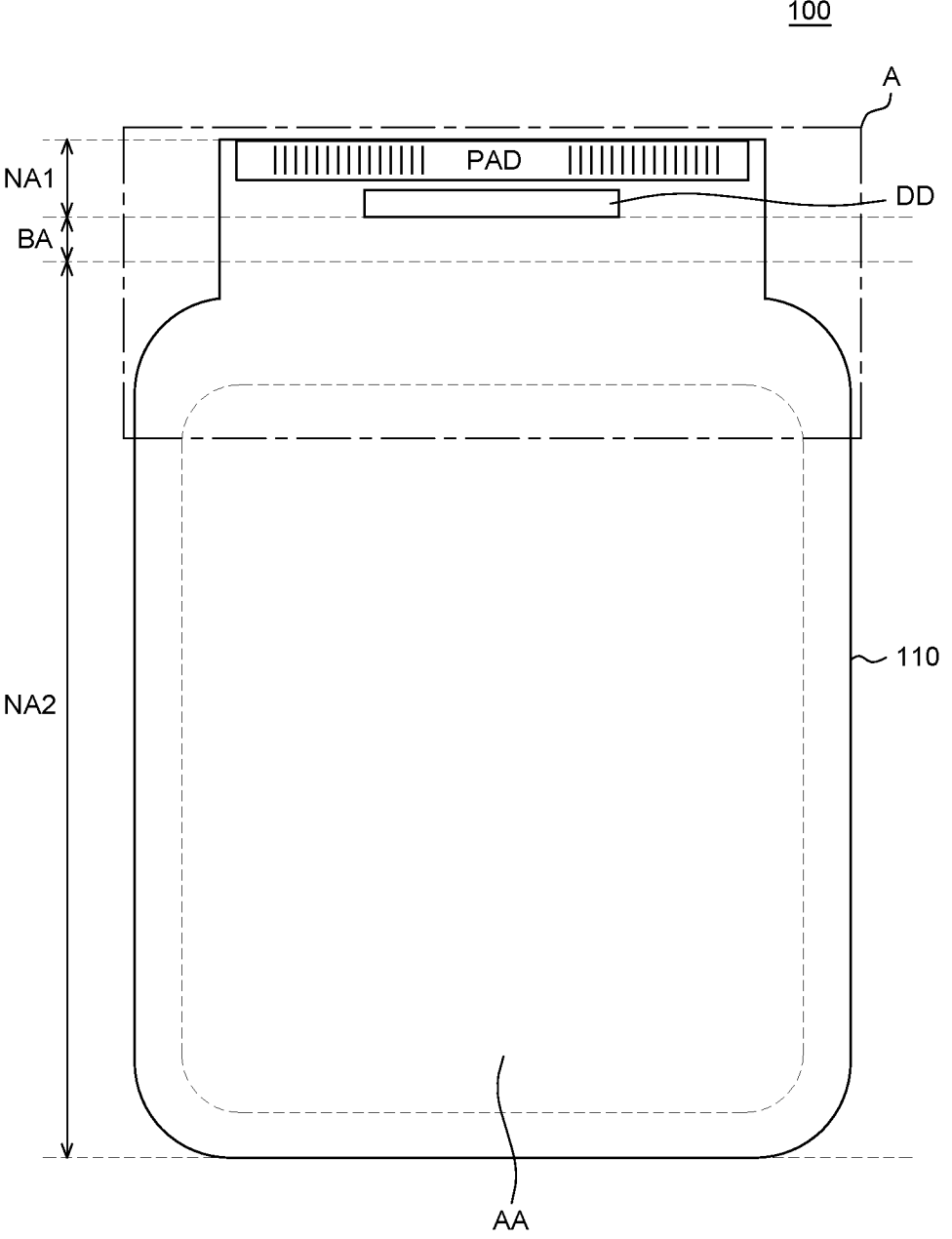
FIG. 1 is a schematic top plan view of a display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, it may be directly on the other element or layer, or another layer or another element may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Same reference numerals generally denote same elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 is a schematic top plan view of a display device according to an embodiment of the present disclosure. For the convenience of description, FIG. 1 illustrates a substrate 110, a pad part PAD, and a data drive unit DD among various constituent elements of a display device 100. However, the display device may include other elements than shown in FIG. 1.

Referring to FIG. 1, the substrate 110 includes a display area AA and a non-display area NA.

The substrate 110 is a base member for supporting various types of components of the display device 100 and may be made of an insulating material. For example, the substrate 110 may be made of a plastic material such as glass or polyimide.

The display area AA is an area in which images are displayed. A plurality of pixels are disposed in the display area AA. Display elements for displaying images and drive parts for operating the display elements may be disposed in the display area AA. For example, in a case in which the display device 100 is an organic light-emitting display device, the display element may be an organic light-emitting element including an anode, an organic layer, and a cathode. The drive part may include various constituent elements such as a power line PL, a gate line, a data line, a thin-film transistor, and a storage capacitor that serve to operate the organic light-emitting element. Hereinafter, for the convenience of description, the assumption is made that the display device 100 is the organic light-emitting display device. However, the display device 100 is not limited to the organic light-emitting display device.

Referring to FIG. 1, the substrate 110 may have variant corner regions. The display area AA may have a shape corresponding to the variant corner regions of the substrate 110. The corners of the substrate 110 and the corners of the display area AA may each have a rounded shape. However, the present disclosure is not limited thereto. The substrate 110 and the display area AA may have various shapes suitable for the design of the electronic apparatus equipped with the display device 100.

The non-display area NA is an area in which no image is displayed. Various lines, various circuits, and the like for operating the display elements in the display area AA are disposed in the non-display area NA. For example, the data drive unit DD, the link line, the pad part PAD, and the like may be disposed in the non-display area NA.

The non-display area NA may be an area extending from the display area AA. However, the present disclosure is not limited thereto. The non-display area NA may be an area that surrounds the display area AA.

In one embodiment, the non-display area NA includes a first non-display area NA1, a bending area BA, and a second non-display area NA2. The second non-display area NA2 is an area extending from the display area AA. The bending area BA is an area extending from the second non-display area NA2. The bending area BA may be bent. The first non-display area NA1 is an area extending from the bending area BA.

The data drive unit DD, the pad part PAD, and the like may be disposed in the first non-display area NA1. Pads connected to various types of signal lines or a PCB are disposed on the pad part PAD. A power supply pad, a data pad, a gate pad, and the like may be disposed on the pad part PAD.

The data drive unit DD may be mounted on or connected to a separate PCB and connected to a display panel through the pad part PAD. Alternatively, the data drive unit DD may be mounted or connected, in the form of a chip-on-panel (COP) between the pad part PAD and the display area AA. The data drive unit DD includes at least one source drive integrated circuit (IC). The at least one source drive IC is supplied with digital video data and a source timing control signal from a timing controller. The at least one source drive IC generates a data voltage by converting digital video data into a gamma voltage in response to the source timing control signal and supplies the data voltage through the data line in the display area AA.

A plurality of bending patterns are disposed in the bending area BA. The bending area BA is an area bent on a final product. Cracks may occur because of stress concentrated on the bending patterns disposed in the bending area BA as the bending area BA is bent. Therefore, the bending pattern may be a pattern having a particular shape in order to reduce the occurrence of cracks. For example, the bending patterns may be made by repeatedly disposing conductive patterns having at least one of a diamond shape, a rhombic shape, a zigzag shape, and a circular shape. However, the present disclosure is not limited thereto. In addition to the above-mentioned shapes, the bending pattern may have other shapes for reducing stress and cracks concentrated on the bending patterns.

The second non-display area NA2 is an area between the bending area BA and the display area AA. The link lines such as the voltage link line and the data link line may be disposed in the second non-display area NA2. That is, the second non-display area NA2 serves to transmit a signal, which is outputted from the drive part to the display area AA. In the case in which the substrate 110 includes the variant corner regions, the second non-display area NA2 may have a shape corresponding to the shape of the substrate 110 and the shape of the display area AA.

Figure 2:
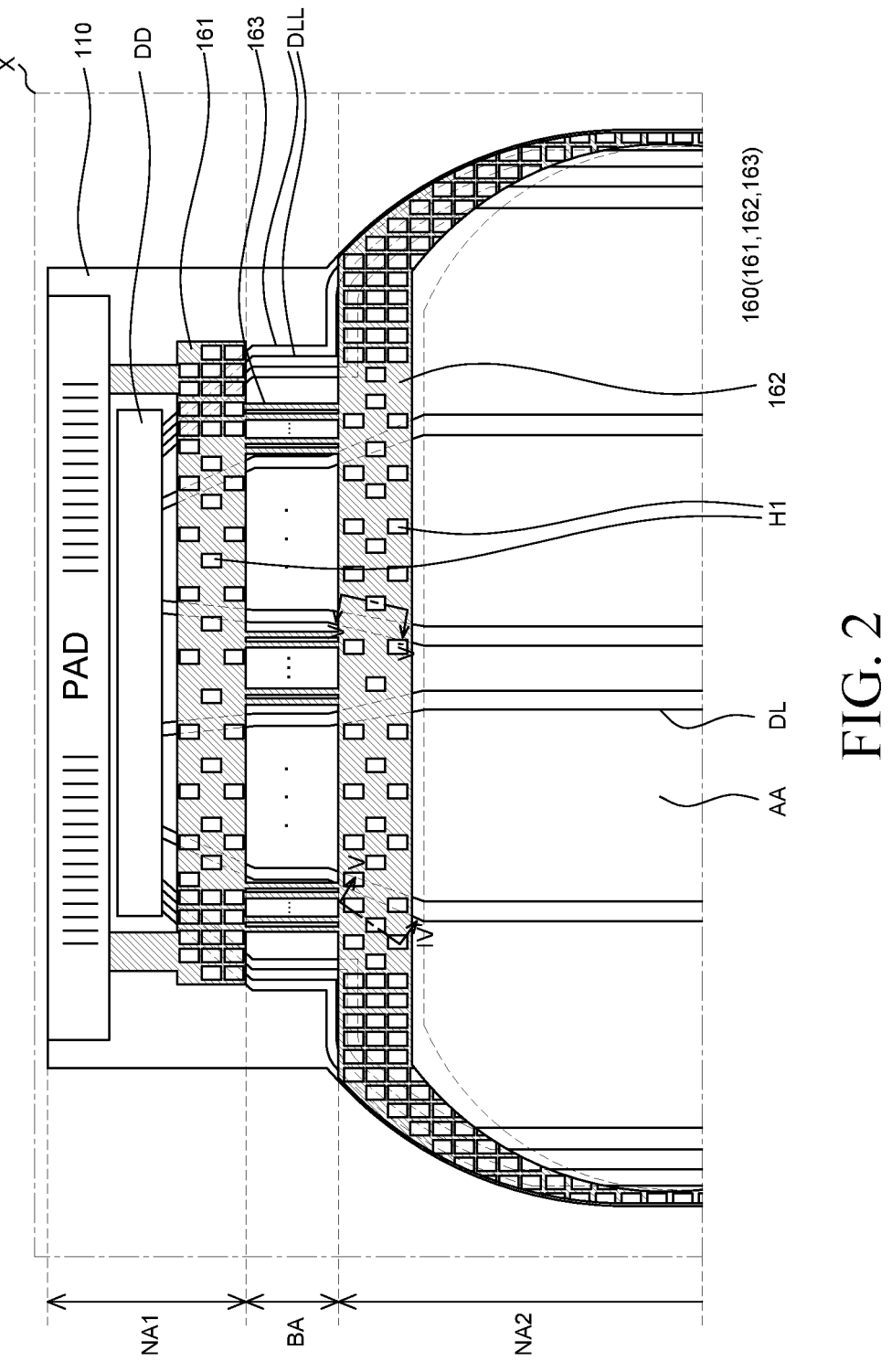
FIG. 2 is an enlarged top plan view of area A in FIG. 1 according to an embodiment of the present disclosure.

FIG. 2 is an enlarged top plan view of area A in FIG. 1 according to one embodiment. For the convenience of description, FIG. 2 illustrates the substrate 110, the pad part PAD, the data drive unit DD, a data line DL, a data link line DLL, and high-potential voltage link lines 160 among various constituent elements of the display device 100. For the convenience of illustration, FIG. 2 illustrates a dotted line indicating the data link line DLL that overlaps the high-potential voltage link line 160.

Referring to FIG. 2, the display device 100 may include the display area AA and the non-display area NA. The non-display area NA may include the first non-display area NA1, the second non-display area NA2, and the bending area BA.

In the display area AA, the plurality of data lines DL and a plurality of gate lines may be disposed to intersect one another. Further, the pixels may be disposed in a matrix shape in each region in which the plurality of data lines DL and the plurality of gate lines intersect one another.

The pixels may each include a light-emitting element and a drive thin-film transistor configured to control the amount of current flowing through the light-emitting element. The pixel of the display device 100 may be supplied with a high-potential voltage through the high-potential voltage link line 160 disposed in the non-display area NA. The pixel of the display device 100 may be supplied with a low-potential voltage through a low-potential voltage link line.

The high-potential voltage link line 160 may be supplied with the high-potential voltage from the power supply pad disposed on the pad part PAD and transmit the high-potential voltage to the high-potential power line disposed in the display area AA. The high-potential voltage link lines 160 may include a first high-potential voltage link line 161, a second high-potential voltage link line 162, and a plurality of third high-potential voltage link lines 163.

The first high-potential voltage link line 161 is disposed in the first non-display area NA1. In this case, the first high-potential voltage link line may be disposed between the bending area BA and the pad part PAD. The first high-potential voltage link line 161 may receive the high-potential voltage from the power supply pad of the pad part PAD.

The third high-potential voltage link line 163 is disposed in the bending area BA and connects together the first high-potential voltage link line 161 and the second high-potential voltage link line 162. Because the third high-potential voltage link line 163 is disposed in the bending area BA, the third high-potential voltage link line 163 may have a pattern having a particular shape for reducing the occurrence of cracks during a bending process. However, the present disclosure is not limited thereto. The third high-potential voltage link line 163 may receive the high-potential voltage from the first high-potential voltage link line 161 and transmit the high-potential voltage to the second high-potential voltage link line 162.

The second high-potential voltage link line 162 is disposed in the second non-display area NA2. Therefore, the second high-potential voltage link line 162 may be disposed between the display area AA and the bending area BA. Therefore, in the case in which the substrate 110 and the display area AA each have the shape corresponding to the variant corner region, the second high-potential voltage link line 162 may have the shape corresponding to the shape of the display area AA and the shape of the substrate 110 in the variant corner region. That is, the second high-potential voltage link line 162 may have a shape that matches a shape of the display area AA and a shape of the substrate 110 in the variant corner region. For example, in the case in which the corner region of the substrate 110 and the corner region of the display area AA each have a rounded shape as illustrated in FIG. 2, a width of the second high-potential voltage link line 162 in the variant corner region may be less than a width of the second high-potential voltage link line 162 in the central region. The second high-potential voltage link line 162 may receive the high-potential voltage from the third high-potential voltage link line 163 and transmit the high-potential voltage to the display area AA.

Next, the pixel of the display device 100 may be supplied with the data voltage through the data link line DLL disposed in the non-display area NA and through the data line disposed in the display area. The data voltage may be supplied to the data drive unit DD through the data pad of the pad part PAD. The data drive unit DD is disposed in the first non-display area NA1 and provided in the form of an integrated circuit (IC). The data drive unit DD samples and latches the data signal supplied from the timing controller, converts the data signal into a gamma reference voltage, and outputs the gamma reference voltage in response to the data timing control signal supplied from the timing controller. The data drive unit DD outputs the data signal through the plurality of data link lines DLL.

Because the data drive unit DD and the data pad disposed in the first non-display area NA1 are connected to the data line in the display area AA through the data link line DLL, the data link line DLL is disposed over the first non-display area NA1, the bending area BA, and the second non-display area NA2. That is, the data link line DLL may extend from the first non-display area NA1 toward the display area AA through the bending area BA. The data link line DLL may be formed as illustrated in FIG. 2. However, the present disclosure is not limited thereto. The data link line DLL formed in the non-display area NA may be connected to the data line DL formed in the display area AA in various ways.

Because the data link line DLL extends from the data drive unit DD toward the display area AA through the non-display area NA, there are regions in the first non-display area NA1 and the second non-display area NA2 where the data link line DLL overlaps the high-potential voltage link line 160. In this case, a plurality of holes H1 may be provided in the region in which the first and second high-potential voltage link lines 161 and 162 overlap the data link line DLL. Therefore, the first and second high-potential voltage link lines 161 and 162 may have a mesh pattern in which the plurality of holes H1 are arranged. However, the present disclosure is not limited thereto. The high-potential voltage link line 160 may have various shapes including the plurality of holes H1.

A proportion of the region in which the plurality of holes H1 are disposed may decrease as an area in which the first and second high-potential voltage link lines 161 and 162 overlap the plurality of data link lines DLL. That is, a proportion of the region in which the plurality of holes H1 are disposed for each unit area of the high-potential voltage link line 160 may increase as the area in which the first and second high-potential voltage link lines 161 and 162 overlap the plurality of data link lines DLL increases. The plurality of data link lines DLL needs to transmit the data signal from the data drive unit DD to the display area AA of the substrate 110. Therefore, the data link line DLL may have the shortest length at the central portion of the substrate 110, and the length of the data link line DLL may increase in a direction toward an outer peripheral region of the substrate 110. That is, the data link line DLL disposed at the central portion of the substrate 110 has a relatively short length and thus has low resistance. The data link line DLL disposed in the outer peripheral region of the substrate 110 has a relatively long length and thus has high resistance. Therefore, the areas of the first and second high-potential voltage link lines 161 and 162, which overlap the data link line DLL disposed at the central portion of the substrate 110, need to be larger than the areas of the first and second high-potential voltage link lines 161 and 162, which overlap the data link line DLL disposed in the outer peripheral region of the substrate 110, in order to reduce a deviation in RC delay between the data link line DLL disposed at the central portion of the substrate 110 and the data link line DLL disposed in the outer peripheral region of the substrate 110. Therefore, the proportion of the region in which the plurality of holes H1 are disposed for each unit area of the first and second high-potential voltage link lines 161 and 162 may increase in the direction from the central portion toward the outer periphery of the substrate 110. Thus, as shown in FIG. 2, a density of holes H1 in the central portion of the substrate where the data link line DLL has a shorter width is less than a density of holes H1 in the corners of the substrate 110 at the outer periphery of the substrate 110 where the data line links DLL have longer lengths than the data link lines DLL in the central portion of the substrate 110. As a result, a density of the holes H1 increases from the central portion of the substrate 110 towards the outer periphery of the substrate 110.

Hereinafter, the constituent elements of the display device 100 according to the embodiment of the present disclosure will be described in more detail with reference to FIGS. 3 to 5.

Figure 3:
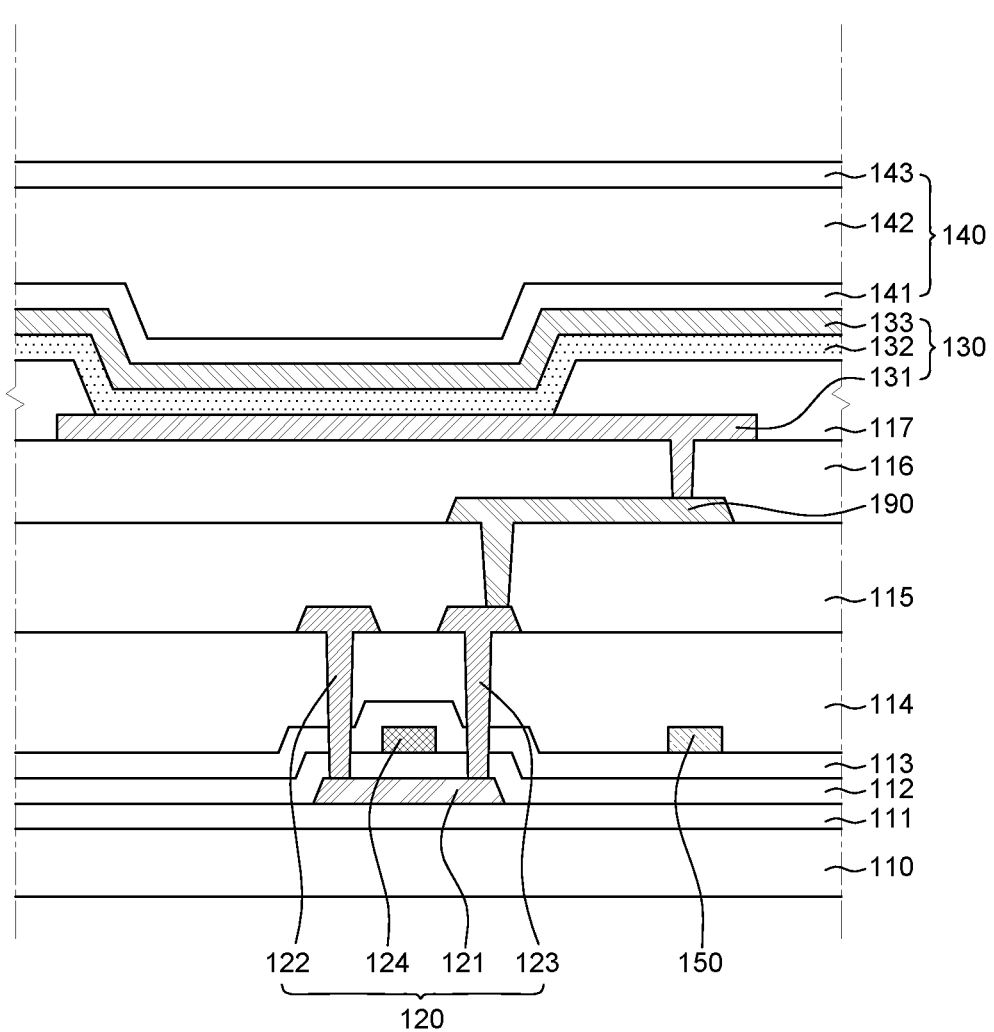
FIG. 3 is a cross-sectional view of the display device according to the embodiment of the present disclosure.

FIG. 3 is a cross-sectional view of the display device according to the embodiment of the present disclosure.

Referring to FIG. 3, the display device 100 according to the embodiment of the present disclosure may include the substrate 110, a buffer layer 111, a first thin-film transistor 120, a gate insulating layer 112, a first interlayer insulating layer 113, a conductive layer 150, a second interlayer insulating layer 114, a first planarization layer 115, a connection electrode 190, a second planarization layer 116, a bank 117, a light-emitting element 130, a sealing part 140, and a conductive layer 150.

The substrate 110 may support various constituent elements of the display device 100. The substrate 110 may be made of glass or a plastic material having flexibility. In the case in which the substrate 110 is made of a plastic material, the substrate 110 may be made of polyimide (PI), for example.

The buffer layer 111 may be disposed on the substrate 110. The buffer layer 111 may be a single layer made of silicon nitride (SiNx) or silicon oxide (SiOx) or a multilayer including the above-mentioned layers. The buffer layer 111 may serve to increase bonding forces between the substrate 110 and layers formed on the buffer layer 111 and block a leak of an alkaline material from the substrate 110.

The thin-film transistor 120 may be disposed on the buffer layer 111. The thin film transistor 120 may include an active layer 121, a gate electrode 124, a source electrode 122, and a drain electrode 123. In this case, in accordance with design of a pixel circuit, the source electrode 122 may be the drain electrode, and the drain electrode 123 may be the source electrode. The active layer 121 of the thin-film transistor 120 may be disposed on the buffer layer 111.

The active layer 121 may be made of various materials such as polysilicon, amorphous silicon, an oxide semiconductor, and the like. The active layer 121 may include a channel region in which a channel is formed when the thin-film transistor 120 operates, and source and drain regions disposed at two opposite sides of the channel region. The source region means a portion of the active layer 121 connected to the source electrode 122. The drain region means a portion of the active layer 121 connected to the drain electrode 123.

The gate insulating layer 112 may be disposed on the active layer 121 of the thin-film transistor 120. The gate insulating layer 112 may be a single layer made of silicon nitride (SiNx) or silicon oxide (SiOx) or a multilayer including the above-mentioned layers. The gate insulating layer 112 may have a contact hole through which the source electrode 122 and the drain electrode 123 of the thin film transistor 120 are connected to the source and drain regions of the active layer 121 of the thin film transistor 120.

The gate electrode 124 of the thin-film transistor 120 may be disposed on the gate insulating layer 112. The gate electrode 124 may be configured as a single layer or multilayer made of any one of molybdenum (Mo), copper (Cu), titanium (Ti), aluminum (Al), chromium (Cr), gold (Au), nickel (Ni), neodymium (Nd), and an alloy thereof. The gate electrode 124 may be formed on the gate insulating layer 112 and overlap the channel region of the active layer 121 of the thin film transistor 120.

The first interlayer insulating layer 113 may be disposed on the gate insulating layer 112 and the gate electrode 124. The first interlayer insulating layer 113 may be a single layer made of silicon nitride (SiNx) or silicon oxide (SiOx) or a multilayer including the above-mentioned layers. The first interlayer insulating layer 113 may have a contact hole through which the source and drain regions of the active layer 121 of the thin film transistor 120 are exposed.

The conductive layer 150 may be disposed on the first interlayer insulating layer 113. The conductive layer 150 may be a line or electrode disposed between the gate electrode 124, the source electrode 122, and the drain electrode 123.

The second interlayer insulating layer 114 may be disposed on the first interlayer insulating layer 113 and the conductive layer 150. The second interlayer insulating layer 114 may have the same material as the first interlayer insulating layer 113. That is, the second interlayer insulating layer 114 may be a single layer made of silicon nitride (SiNx) or silicon oxide (SiOx) or a multilayer including the above-mentioned layers. The second interlayer insulating layer 114 may have a contact hole through which the source and drain regions of the active layer 121 of the thin film transistor 120 are exposed.

The source electrode 122 and the drain electrode 123 of the thin-film transistor 120 may be disposed on the second interlayer insulating layer 114.

The source electrode 122 and the drain electrode 123 of the thin-film transistor 120 may be connected to the active layer 121 of the thin-film transistor 120 through the contact holes formed in the gate insulating layer 112, the first interlayer insulating layer 113, and the second interlayer insulating layer 114. Therefore, the source electrode 122 of the thin-film transistor 120 may be connected to the source region of the active layer 121 through the contact holes formed in the gate insulating layer 112, the first interlayer insulating layer 113, and the second interlayer insulating layer 114. Further, the drain electrode 123 of the thin-film transistor 120 may be connected to the drain region of the active layer 121 through the contact holes formed in the gate insulating layer 112, the first interlayer insulating layer 113, and the second interlayer insulating layer 114.

The source electrode 122 and the drain electrode 123 of the thin-film transistor 120 may be formed by the same process. Further, the source electrode 122 and the drain electrode 123 of the thin-film transistor 120 may be made of the same material. The source electrode 122 and the drain electrode 123 of the thin-film transistor 120 may each be configured as a single layer or multilayer made of any one of molybdenum (Mo), copper (Cu), titanium (Ti), aluminum (Al), chromium (Cr), gold (Au), nickel (Ni), and neodymium (Nd) or an alloy thereof.

The first planarization layer 115 may be disposed on the source electrode 122, the drain electrode 123, and the second interlayer insulating layer 114. As illustrated in FIG. 3, the first planarization layer 115 may have a contact hole through which the drain electrode 123 is exposed. The first planarization layer 115 may be an organic material layer for flattening an upper portion of the thin-film transistor 120. For example, the first planarization layer 115 may be made of an organic material such as acrylic resin, epoxy resin, phenolic resin, polyamide resin, and polyimide resin. However, the present disclosure is not limited thereto. The first planarization layer 115 may be an inorganic material layer for protecting the thin-film transistor 120. For example, the first planarization layer 115 may be made of an inorganic material such as silicon nitride (SiNx) or silicon oxide (SiOx). The first planarization layer 115 may be a single layer made of silicon nitride (SiNx) or silicon oxide (SiOx) or a multilayer including the above-mentioned layers.

The connection electrode 190 may be disposed on the first planarization layer 115. Further, the connection electrode 190 may be connected to the drain electrode 123 of the thin-film transistor 120 through the contact hole of the first planarization layer 115. The connection electrode 190 may serve to electrically connect the thin-film transistor 120 and the light-emitting element 130. For example, the connection electrode 190 may serve to electrically connect the drain electrode 123 of the thin film transistor 120 and a first electrode 131 of the light-emitting element 130. The connection electrode 190 may be configured as a single layer or multilayer made of any one of molybdenum (Mo), copper (Cu), titanium (Ti), aluminum (Al), chromium (Cr), gold (Au), nickel (Ni), neodymium (Nd), and an alloy thereof. The connection electrode 190 may be made of the same material as the source electrode 122 and the drain electrode 123 of the thin film transistor 120.

The second planarization layer 116 may be disposed on the connection electrode 190 and the first planarization layer 115. Further, as illustrated in FIG. 3, the second planarization layer 116 may have a contact hole through which the connection electrode 190 is exposed. The second planarization layer 116 may be an organic material layer for flattening an upper portion of the thin-film transistor 120. For example, the second planarization layer 116 may be made of an organic material such as acrylic resin, epoxy resin, phenolic resin, polyamide resin, and polyimide resin.

The light-emitting element 130 may be disposed on the second planarization layer 116. The light-emitting element 130 may include the first electrode 131, a light-emitting structure 132, and a second electrode 133. The first electrode 131 of the light-emitting element 130 may be disposed on the second planarization layer 116. The first electrode 131 may be electrically connected to the connection electrode 190 through the contact hole formed in the second planarization layer 116. Therefore, the first electrode 131 of the light-emitting element 130 may be connected to the connection electrode 190 through the contact hole formed in the second planarization layer 116, such that the first electrode 131 may be electrically connected to the thin-film transistor 120.

The first electrode 131 may have a multilayered structure including a transparent conductive film and an opaque conductive film having high reflection efficiency. The transparent conductive film may be made of a material such as indium-tin-oxide (ITO) or indium-zinc-oxide (IZO) having a comparatively large work function value. Further, the opaque conductive film may have a single-layered or multilayered structure made of Al, Ag, Cu, Pb, Mo, Ti, or an alloy thereof. For example, the first electrode 131 may have a structure in which the transparent conductive film, the opaque conductive film, and the transparent conductive film are sequentially stacked. However, the present disclosure is not limited thereto. The first electrode may have a structure in which the transparent conductive film and the opaque conductive film are sequentially stacked.

Because the display device 100 according to the embodiment of the present disclosure is a top emission display device, the first electrode 131 may be an anode electrode. When the display device 100 is a bottom emission display device, the first electrode 131 disposed on the second planarization layer 116 may be a cathode electrode.

The bank 117 may be disposed on the first electrode 131 and the second planarization layer 116. The bank 117 may have an opening portion through which the first electrode 131 is exposed. Because the bank 117 may define a light-emitting region of the display device 100, the bank may be referred to as a pixel definition film.

The light-emitting structure 132 including a light-emitting layer may be disposed on the first electrode 131.

The light-emitting structure 132 of the light-emitting element 130 may be formed by stacking a positive hole layer, a light-emitting layer, and an electron layer in this order or in the reverse order on the first electrode 131. In addition, the light-emitting structure 132 may have first and second light-emitting structures facing each other with a charge generation layer interposed therebetween. In this case, the light-emitting layer of any one of the first and second light-emitting structures emits blue light, and the light-emitting layer of the other of the first and second light-emitting structures emits yellow-green light. There-fore, white light may be emitted by the first and second light-emitting structures. The white light emitted by the light-emitting structure 132 may enter a color filter posi-tioned on an upper portion of the light-emitting structure 132, thereby implementing a color image. In addition, the light-emitting structures 132 may each emit color light corresponding to each subpixel, thereby implementing a color image without a separate color filter. For example, the light-emitting structure 132 for a red (R) subpixel may emit red light, the light-emitting structure 132 for a green (G) subpixel may emit green light, and the light-emitting struc-ture 132 for a blue (B) subpixel may emit blue light.

The second electrode 133 may be further disposed on the light-emitting structure 132. The second electrode 133 of the light-emitting element 130 may be disposed on the light-emitting structure 132 and face the first electrode 131 with the light-emitting structure 132 interposed therebetween. In the display device 100 according to the embodiment of the present disclosure, the second electrode 133 may be a cathode electrode. The sealing part 140 for suppressing the penetration of moisture may be further disposed on the second electrode 133.

The sealing part 140 may include a first inorganic sealing layer 141, an organic sealing layer 142, and a second inorganic sealing layer 143. The first inorganic sealing layer 141 of the sealing part 140 may be disposed on the second electrode 133. Further, the organic sealing layer 142 may be disposed on the first inorganic sealing layer 141. In addition, the second inorganic sealing layer 143 may be disposed on the organic sealing layer 142. The first inorganic sealing layer 141 and the second inorganic sealing layer 143 of the sealing part 140 may each be made of an inorganic material such as silicon nitride (SiNx) or silicon oxide (SiOx). The organic sealing layer 142 of the sealing part 140 may be made of an organic material such as acrylic resin, epoxy resin, phenolic resin, polyamide resin, and polyimide resin.

The second inorganic sealing layer 143 may cover top and side surfaces of each of the first inorganic sealing layer 141 and the organic sealing layer 142. The second inorganic sealing layer 143 may reduce or suppress the penetration of outside moisture or oxygen into the first inorganic sealing layer 141 and the organic sealing layer 142. In this case, the first inorganic sealing layer 141 and the second inorganic sealing layer 143 may serve to suppress the penetration of moisture or oxygen. The organic sealing layer 142 may serve to flatten an upper portion of the first inorganic sealing layer

141. Therefore, the sealing part 140 may cover a gate drive circuit and a dam in the display area AA and the non-display area NA. However, the configuration of the sealing part 140 is not limited thereto.

Figure 4:
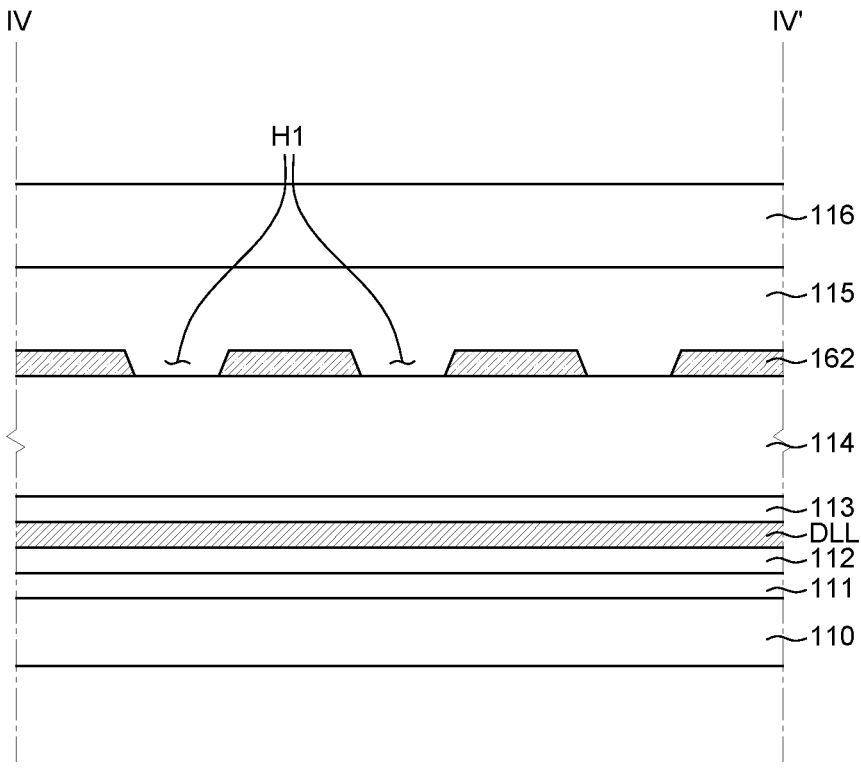
FIG. 4 is a cross-sectional view taken along line IV-IV' in FIG. 2 according to an embodiment of the present disclosure.

FIG. 4 is a cross-sectional view taken along line IV-IV' in FIG. 2 according to one embodiment. FIG. 5 is a cross-sectional view taken along line V-V' in FIG. 2 according to one embodiment. For the convenience of description, FIGS. 4 and 5 illustrate only the constituent elements from the substrate 110 to the second planarization layer 116 among various constituent elements of the display device 100. Only the second high-potential voltage link line 162 has been described with reference to FIGS. 4 and 5. The structure of the second high-potential voltage link line 162 may be equally applied to the first high-potential voltage link line 161.

Figure 5:
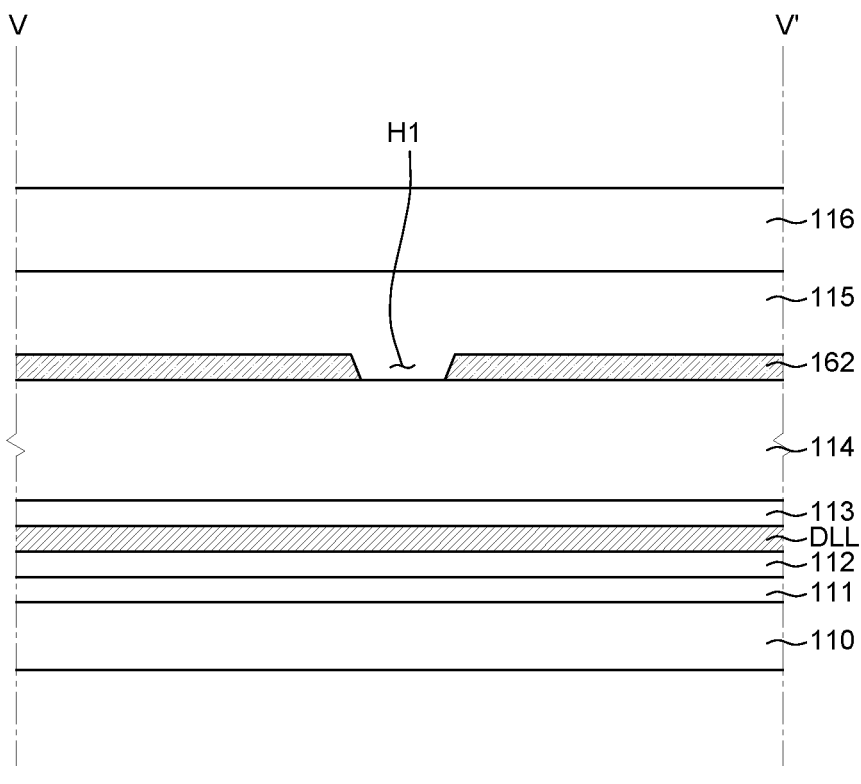
FIG. 5 is a cross-sectional view taken along line V-V' in FIG. 2 according to an embodiment of the present disclosure.

Referring to FIGS. 4 and 5, the data link line DLL may be disposed between the gate insulating layer 112 and the first interlayer insulating layer 113. That is, the data link line DLL may be formed on the same layer as the gate electrode 124 of the thin-film transistor 120 in the display area AA. However, the present disclosure is not limited thereto. The data link line DLL may be formed on the same layer as the conductive layer 150 in the display area AA. That is, the data link line DLL may be disposed between the first interlayer insulating layer 113 and the second interlayer insulating layer 114. Specifically, in the first non-display area NA1 and the second non-display area NA2, the data link line DLL may be formed on the same layer as the gate electrode 124 or the conductive layer 150. However, the present disclosure is not limited thereto. The data link line DLL may be made of the same material and formed on the same layer as various conductive constituent elements on the substrate 110. How-ever, the data link line DLL may be disposed on a layer different from a layer on which the high-potential voltage link line 160 is disposed.

The high-potential voltage link line 160 may be disposed on the second interlayer insulating layer 114. The first planarization layer 115 and the second planarization layer 116 may be disposed on the second high-potential voltage link line 162. FIGS. 4 and 5 are cross-sectional views taken along lines IV-IV' and V-V' in FIG. 2. The second high-potential voltage link line 162 may be disposed on the second interlayer insulating layer 114.

As described above, the plurality of holes H1 may be provided in the region in which the first and second high-potential voltage link lines 161 and 162 overlap the data link line DLL. Therefore, the first and second high-potential voltage link lines 161 and 162 may have the mesh pattern in which the plurality of holes H1 are arranged.

In addition, a proportion of the region occupied by the plurality of holes H1 for each unit area of the high-potential voltage link line 160 may decrease as the area in which the first high-potential voltage link line 161 and the second high-potential voltage link line 162 overlap the plurality of data link lines DLL decreases. The plurality of data link lines DLL transmit the data signal from the data drive unit DD to the display area AA of the substrate 110. Therefore, the data link line DLL may have the shortest length at the central portion of the substrate 110, and the length of the data link line DLL may increase in the direction toward the outer peripheral region of the substrate 110. That is, the data link line DLL disposed at the central portion of the substrate 110 has a relatively short length compared to the data link line DLL in the outer peripheral region and thus has lower resistance compared to the resistance of the data link line DLL in the outer peripheral region. The data link line DLL disposed in the outer peripheral region of the substrate 110 has a relatively long length compared to the data link line DLL in the central portion of the substrate 110 and thus has higher resistance compared to the resistance of the data link line DLL in the central portion of the substrate 110. Therefore, the areas of the first and second high-potential voltage link lines 161 and 162, which overlap the data link line DLL disposed at the central portion of the substrate 110, need to be larger than the areas of the first and second high-potential voltage link lines 161 and 162, which overlap the data link line DLL disposed in the outer peripheral region of the substrate 110, in order to reduce a deviation in RC delay between the data link line DLL disposed at the central portion of the substrate 110 and the data link line DLL disposed in the outer peripheral region of the substrate 110. Therefore, the proportion of the region in which the plurality of holes H1 are disposed for each unit area of the first and second high-potential voltage link lines 161 and 162 may increase in the direction from the central portion toward the outer periphery of the substrate 110.

Referring to FIGS. 2, 4, and 5, the proportion of the region in which the plurality of holes H1 for each unit area of the first and second high-potential voltage link lines 161 and 162 are disposed may vary depending on the number of holes H1. That is, the sizes of the plurality of holes H1 are equal to one another in the entire region of the high-potential voltage link line 160, but the length of the high-potential voltage link line 160 is relatively long. Therefore, the number of holes H1 disposed on the high-potential voltage link line 160 for each unit area may increase as the region in which the high-potential voltage link line overlaps the data link line DLL increases (or decrease as the region in which the high-potential voltage link line overlaps the data link line DLL decreases). That is, the length of the data link line DLL which overlaps the high-potential voltage link line 160 at the central portion of the substrate 110 is short, and the length of the data link line DLL which overlaps the high-potential voltage link line 160 at the outer periphery of the substrate 110 is long. Therefore, the number of holes H1 on the first and second high-potential voltage link line 161 and 162 may be greater at the outer periphery of the substrate 110 than at the central portion of the substrate 110.

In the general display device, the data link line DLL includes a portion extending in an oblique direction instead of a rectilinear direction in order to reduce the size of the non-display area NA. Therefore, the length of the data link line may vary depending on the position or the like of the data link line. For example, among the plurality of data link lines that receive signals from the same data drive unit, the length of the data link line disposed at the central portion is relatively short, whereas the length of the data link line disposed in the outer peripheral region is relatively long. Therefore, line resistance of the link line disposed in the outer peripheral region is greater than line resistance of the link line disposed at the central portion, which causes a problem in that an RC delay value of the data link line in the outer peripheral region is larger than an RC delay value of the data link line at the central portion.

In addition, a demand for a high-resolution, high-speed operating product increases, and resolution of the display device increases, such that a data load of the display panel increases. Therefore, there is a problem in that the pixel charging time gradually decreases, and the operating time is insufficient. When the operating time is insufficient as described above, the pixels, which are not yet charged with the data voltage, are produced because of the RC delay. For this reason, a defect in which colors of the pixels disposed adjacent to each other are mixed may occur. Therefore, there is a need to reduce the RC delay of the data link line. Because the RC delay of the data link line is proportional to the data load of the display panel, the data load needs to be reduced in the case of a high-resolution, large-area product. In this case, the data load of the display panel is determined depending on resistance and capacitance of the data link line, and the resistance and the capacitance of the data link line increases in proportion to the length of the line. Therefore, the data load of the display panel tends to further increase in the outer peripheral region in comparison with the central portion of the substrate.

Therefore, in the display device 100 according to the embodiment of the present disclosure, the plurality of holes H1 are differently disposed for the respective regions on the first and second high-potential voltage link lines 161 and 162 that overlap the data link line DLL. Therefore, the deviation in RC delay between the plurality of data link lines DLL may be reduced. When the plurality of holes H1 are disposed on the high-potential voltage link line 160, the area in which the high-potential voltage link line 160 overlaps the data link line DLL decreases, such that parasitic capacitance applied to the data link line DLL may decrease. When the parasitic capacitance applied to the data link line DLL decreases, the resistance of the data link line DLL remains the same, but the data load decreases. Therefore, the RC delay of the data link line decreases, which may be advantageous in ensuring the operating time even in the case of the high-resolution, high-speed operating product.

In addition, in the display device 100 according to the embodiment of the present disclosure, a proportion of the region of the plurality of holes H1 may increase in proportion to the area in which the data link line DLL overlaps the high-potential voltage link line 160. This is to maximally decrease the region in which the data link line DLL overlaps the high-potential voltage link line 160 by disposing a greater number of holes H1 because the parasitic capacitance increases as the region in which the data link line DLL overlaps the high-potential voltage link line 160 increases. Among the plurality of data link lines DLL, the data link line DLL disposed at the central portion of the substrate 110 may have a relatively short length and thus have low resistance. The region in which the data link line DLL disposed at the central portion of the substrate 110 overlaps the high-potential voltage link line 160 may be small. On the contrary, among the plurality of data link lines DLL, the data link line DLL disposed in the outer peripheral region of the substrate 110 may have a relatively long length and thus have high resistance. The region in which the data link line DLL disposed in the outer peripheral region of the substrate 110 overlaps the high-potential voltage link line 160 may be large. Therefore, the number of holes H1 disposed on the first and second high-potential voltage link lines 161 and 162 may increase in the direction from the central portion to the outer peripheral region of the substrate 110 so that the parasitic capacitance applied to the data link line DLL disposed in the outer peripheral region of the substrate 110 is lower than the parasitic capacitance applied to the data link line disposed at the central portion of the substrate. Therefore, in the display device 100 according to the embodiment of the present disclosure, the number of holes H1 varies depending on the area in which the data link line DLL overlaps the high-potential voltage link line 160. Therefore, it is possible to reduce the deviation in RC delay between the plurality of data link lines and improve the image quality.

Figure 6:
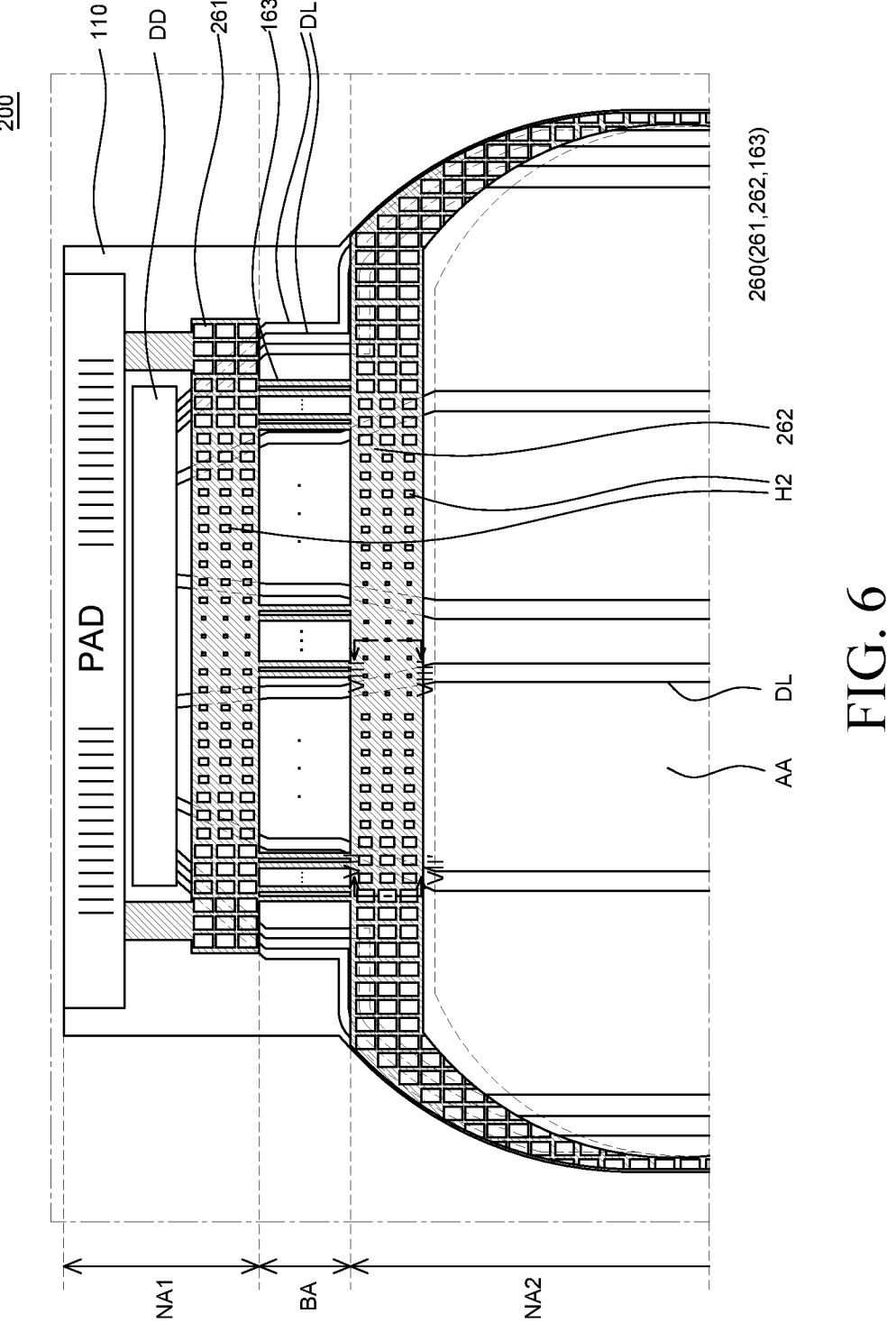
FIG. 6 is an enlarged top plan view of a display device according to another embodiment of the present disclosure.
Figure 7:
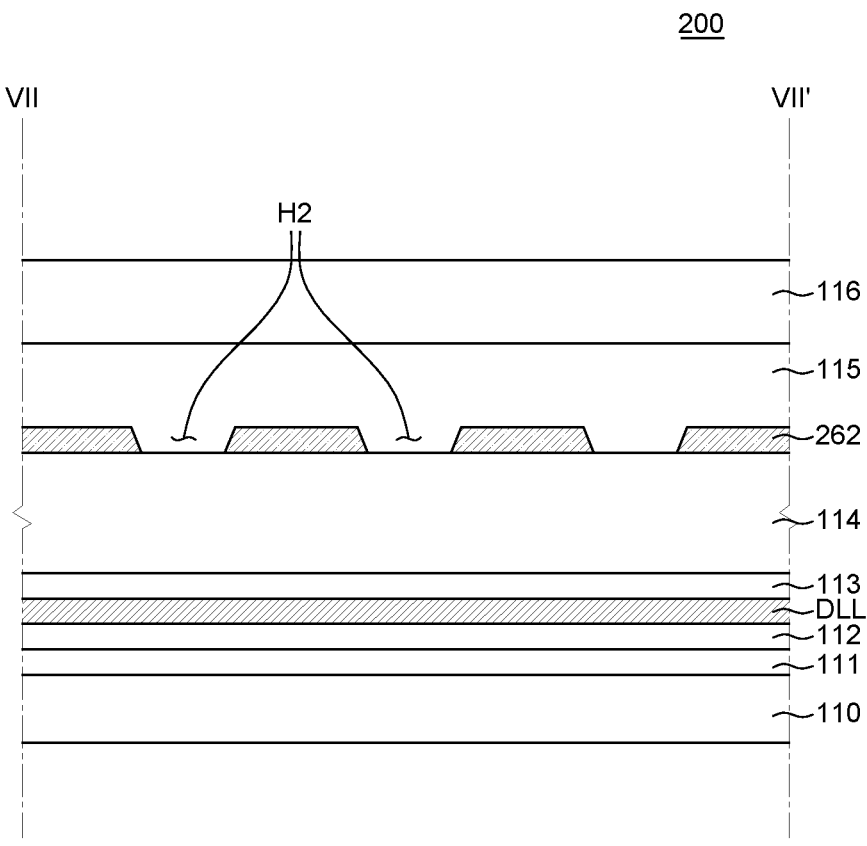
FIG. 7 is a cross-sectional view taken along line VII-VII' in FIG. 6 according to the other embodiment of the present disclosure.
Figure 8:
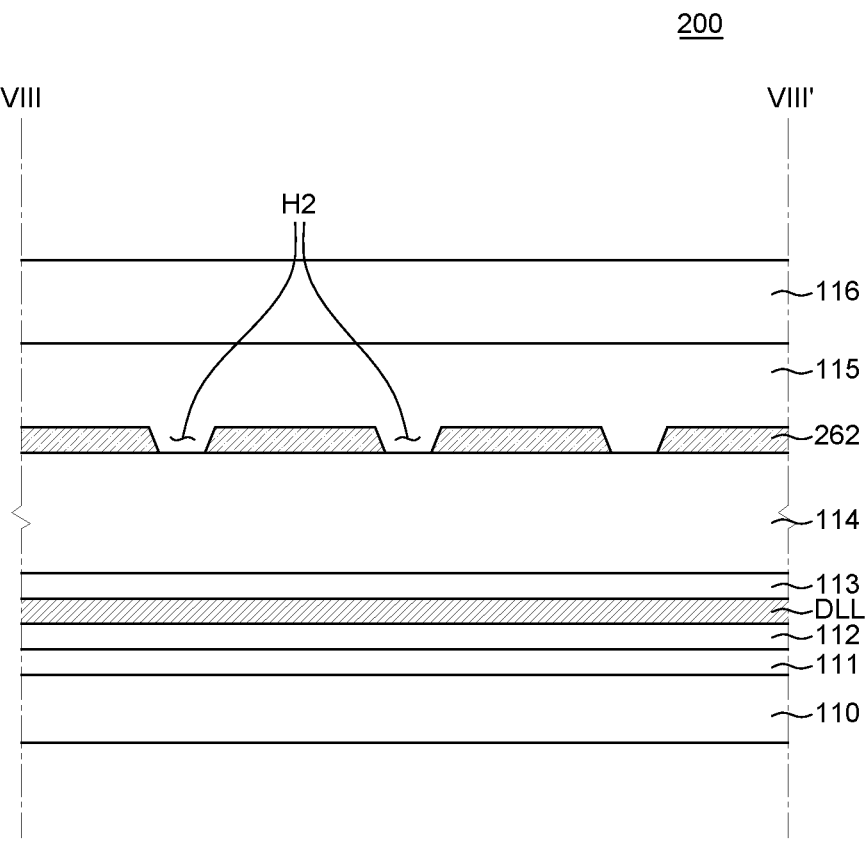
FIG. 8 is a cross-sectional view taken along line VIII-VIII' in FIG. 6 according to the other embodiment of the present disclosure.

FIG. 6 is an enlarged top plan view of a display device according to another embodiment of the present disclosure. FIG. 7 is a cross-sectional view taken along line VII-VII' in FIG. 6 according to the other embodiment of the present disclosure. FIG. 8 is a cross-sectional view taken along line VIII-VIII' in FIG. 6. For the convenience of description, FIG. 6 illustrates only the substrate 110, the pad part PAD, the data drive unit DD, the data line DL, the data link line DLL, and high-potential voltage link lines 260 among various constituent elements of a display device 200. For the convenience of illustration, FIG. 6 illustrates the dotted line indicating the data link line DLL that overlaps the high-potential voltage link line 260. For the convenience of description, FIGS. 7 and 8 illustrate only the constituent elements from the substrate 110 to the second planarization layer 116 among various constituent elements of the display device 200. Only a second high-potential voltage link line 262 has been described with reference to FIGS. 7 and 8. The structure of the second high-potential voltage link line 262 may be equally applied to a first high-potential voltage link line 261.

Because the data link line DLL extends from the data drive unit DD toward the display area AA through the non-display area NA, there occurs a region in which the data link line DLL overlaps the high-potential voltage link line 260. In this case, a plurality of holes H2 may be provided in the region in which the first and second high-potential voltage link lines 261 and 262 overlap the data link line DLL. Therefore, the first and second high-potential voltage link lines 261 and 262 may have a mesh pattern in which the plurality of holes H2 are arranged. However, the present disclosure is not limited thereto. The high-potential voltage link line 260 may have various shapes including the plurality of holes H2.

The sizes of the plurality of holes H2 of the high-potential voltage link line 260 may decrease as the area in which the first and second high-potential voltage link lines 261 and 262 overlap the plurality of data link lines DLL decreases. That is, a size of holes H2 in the high-potential voltage link lines increases from the center of the substrate 110 towards the outer periphery of the substrate 110. The plurality of data link lines DLL needs to transmit the data signal from the data drive unit DD to the display area AA of the substrate 110. Therefore, the data link line DLL may have the shortest length at the central portion of the substrate 110, and the length of the data link line DLL may increase in the direction toward the outer peripheral region of the substrate 110. That is, the data link line DLL disposed at the central portion of the substrate 110 has a relatively short length and thus has low resistance compared to the data link line DLL at the outer periphery of the substrate 110. The data link line DLL disposed in the outer peripheral region of the substrate 110 has a relatively long length and thus has high resistance compared to the data link line DLL at the central portion of the substrate 110. Therefore, the areas of the first and second high-potential voltage link lines 261 and 262, which overlap the data link line DLL disposed at the central portion of the substrate 110, need to be larger than the areas of the first and second high-potential voltage link lines 261 and 262, which overlap the data link line DLL disposed in the outer peripheral region of the substrate 110, in order to reduce a deviation in RC delay between the data link line DLL disposed at the central portion of the substrate 110 and the data link line DLL disposed in the outer peripheral region of the substrate 110. Therefore, the numbers of holes H2 disposed for each unit area of the first and second high-potential voltage link lines 261 and 262 are equal to one another. However, the sizes of the plurality of holes H2 may increase in the direction from the central portion to the outer periphery of the substrate.

Referring to FIGS. 6 to 8, the sizes of the plurality of holes H2 may vary depending on the regions of the first and second high-potential voltage link lines 261 and 262. That is, the number of holes H2 for each unit area (e.g., density) is constant in the entire region, but the length of the high-potential voltage link line 260 is relatively long. Therefore, the sizes of the plurality of holes H2 disposed on the high-potential voltage link line 260 may increase as the region in which the high-potential voltage link line 260 overlaps the data link line DLL increases. That is, the length of the data link line DLL, which overlaps the high-potential voltage link line 260 at the central portion of the substrate 110, is short, and the length of the data link line DLL, which overlaps the high-potential voltage link line 260 at the outer periphery of the substrate 110, is long. Therefore, the sizes of the plurality of holes H2 on the first and second high-potential voltage link line 261 and 262 may be larger at the outer periphery of the substrate 110 than at the central portion of the substrate 110.

In the display device 200 according to another embodiment of the present disclosure, the plurality of holes H2 are differently disposed for the respective regions on the first and second high-potential voltage link lines 261 and 262 that overlap the data link line DLL. Therefore, the deviation in RC delay between the plurality of data link lines DLL may be reduced. When the plurality of holes H2 are disposed on the high-potential voltage link line 260, the area in which the high-potential voltage link line 260 overlaps the data link line DLL decreases, such that parasitic capacitance applied to the data link line DLL may decrease. When the parasitic capacitance applied to the data link line DLL decreases, the resistance of the data link line DLL remains the same, but the data load decreases. Therefore, the RC delay of the data link line decreases, which may be advantageous in ensuring the operating time even in the case of the high-resolution, high-speed operating product.

In addition, in the display device 200 according to another embodiment of the present disclosure, the size of the plurality of holes H2 may increase in proportion to the area in which the data link line DLL overlaps the high-potential voltage link line 260. This is to maximally decrease the region in which the data link line DLL overlaps the high-potential voltage link line 260 by increasing the sizes of the plurality of holes H2 because the parasitic capacitance increases as the region in which the data link line DLL overlaps the high-potential voltage link line 260 increases. Among the plurality of data link lines DLL, the data link line DLL disposed at the central portion of the substrate 110 may have a relatively short length and thus have low resistance. The region in which the data link line DLL disposed at the central portion of the substrate 110 overlaps the high-potential voltage link line 260 may be small. On the contrary, among the plurality of data link lines DLL, the data link line DLL disposed in the outer peripheral region of the substrate 110 may have a relatively long length and thus have high resistance. The region in which the data link line DLL disposed in the outer peripheral region of the substrate 110 overlaps the high-potential voltage link line 260 may be large. Therefore, the sizes of the plurality of holes H2 disposed on the first and second high-potential voltage link lines 261 and 262 may increase in the direction from the central portion to the outer peripheral region of the substrate 110 so that the parasitic capacitance applied to the data link line DLL disposed in the outer peripheral region of the substrate 110 is lower than the parasitic capacitance applied to the data link line DLL disposed at the central portion of the substrate 110. Therefore, in the display device 200 according to another embodiment of the present disclosure, the sizes of the plurality of holes H2 vary depending on the area in which the data link line DLL overlaps the high-potential voltage link line 260. Therefore, it is possible to minimize the deviation in RC delay between the plurality of data link lines DLL and improve the image quality.

The exemplary embodiments of the present disclosure can also be described as follows:

According to an aspect of the present disclosure, there is provided a display device. The display device includes a substrate including a display area and a non-display area configured to surround the display area. The display device further includes a plurality of pixels disposed in the display area. The display device further includes a data drive unit disposed in the non-display area. The display device further includes a plurality of data lines disposed in the display area. The display device further includes a plurality of data link lines disposed in the non-display area and configured to connect the data drive unit and the plurality of data lines. The display device further includes high-potential voltage link lines disposed in the non-display area and configured to supply high-potential voltages to the plurality of pixels. The high-potential voltage link lines include a plurality of holes disposed in regions in which the high-potential voltage link lines overlap the plurality of data link lines.

The high-potential voltage link lines may be disposed in a mesh pattern.

The non-display area may include: a first non-display area in which the data drive unit is disposed; a second non-display area disposed between the first non-display area and the display area; and a bending area disposed between the first non-display area and the second non-display area.

The high-potential voltage link lines may include: a first high-potential voltage link line disposed in the first non-display area and provided to overlap the plurality of data link lines; a second high-potential voltage link line disposed in the second non-display area and provided to overlap the plurality of data link lines; and a plurality of third high-potential voltage link lines disposed in the bending area and configured to connect the first and second high-potential voltage link lines.

The plurality of holes may be disposed on the first and second high-potential voltage link lines.

A proportion of a region in which the plurality of holes are disposed may decrease as an area in which the first and second high-potential voltage link lines overlap the plurality of data link lines decreases.

The number of holes for each unit area may decrease as the area in which the first and second high-potential voltage link lines overlap the plurality of data link lines decreases.

The sizes of the plurality of holes may decrease as the area in which the first and second high-potential voltage link lines overlap the plurality of data link lines decreases.

A proportion of the region in which the plurality of holes are disposed on the first and second high-potential voltage link lines may increase in a direction from a central portion to an outer periphery of the substrate.

The substrate may have a variant corner region, the display area may have a shape corresponding to the variant corner region, and the second high-potential voltage link line in the variant corner region may have a shape corresponding to the shape of the display area and the shape of the substrate.

A corner of the substrate and a corner of the display area may each have a rounded shape.

A width in the variant corner region of the second high-potential voltage link line may be smaller than a width in a central region of the second high-potential voltage link line.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
   a substrate including a display area and a non-display area that at least partially surrounds the display area;
   a plurality of pixels in the display area;
   a data drive unit in the non-display area;
   a plurality of data lines in the display area;
   a plurality of data link lines in the non-display area, the plurality of data link lines electrically connecting together the data drive unit and the plurality of data lines; and
   high-potential voltage link lines in the non-display, the high-potential voltage link lines configured to supply high-potential voltages to the plurality of pixels and including a first portion and a second portion that extends from the first portion and is longer than the first portion,
   wherein the high-potential voltage link lines include a plurality of holes in regions of the first portion and the second portion of the high-potential voltage link lines that overlap the plurality of data link lines in the non-display area.

2. The display device of claim 1, wherein the high-potential voltage link lines comprise a mesh pattern.

3. The display device of claim 1, wherein the non-display area includes:
   a first non-display area, the data drive unit in the first non-display area;
   a second non-display area between the first non-display area and the display area; and
   a bending area between the first non-display area and the second non-display area, wherein the high-potential voltage link lines include:
      a first high-potential voltage link line in the first non-display area, the first high-potential voltage link line overlapping a first part of the plurality of data link lines in the first non-display area;
      a second high-potential voltage link line in the second non-display area, the second high-potential voltage link line overlapping a second part of the plurality of data link lines in the second non-display area; and
      a plurality of third high-potential voltage link lines in the bending area, the plurality of third-high potential voltage link lines electrically connecting the first high-potential voltage link line and the second high-potential voltage link line, wherein the plurality of holes are in the first high-potential voltage link line and the second high-potential voltage link line.

4. The display device of claim 3, wherein a proportion of a region in which the plurality of holes are disposed decreases as an area in which the first high-potential voltage link line and the second high-potential voltage link line overlap the plurality of data link lines decreases.

5. The display device of claim 4, wherein a number of holes from the plurality of holes for each unit area decreases as the area in which the first high-potential voltage link line and the second high-potential voltage link line overlap the plurality of data link lines decreases.

6. The display device of claim 4, wherein a proportion of the region in which the plurality of holes are disposed in the first high-potential voltage link line and the second high-potential voltage link line increases in a direction from a central portion of the substrate to an outer periphery of the substrate.

7. The display device of claim 3, wherein sizes of the plurality of holes decreases as an area in which the first high-potential voltage link line and the second high-potential voltage link line overlap the plurality of data link lines decreases.

8. The display device of claim 7, wherein a number of holes for each unit area in the first high-potential voltage link line and the second high-potential voltage link line is constant.

9. The display device of claim 3, wherein the substrate has a corner region, the display area has a shape corresponding to the corner region, and the second high-potential voltage link line in the corner region has a shape corresponding to the shape of the display area and the shape of the substrate.

10. The display device of claim 9, wherein a corner of the substrate has a rounded shape and a corner of the display area has the rounded shape.

11. The display device of claim 9, wherein a width in the corner region of the second high-potential voltage link line is less than a width in a central region of the second high-potential voltage link line.

12. The display device of claim 3, wherein the plurality of data link lines extend from the first non-display area to the display area.

13. The display device of claim 3, wherein first areas of the first high-potential voltage link line and the second high-potential voltage link line that overlap a data link line from the plurality of data link lines that is at a central portion of the substrate are larger than second areas of the first high-potential voltage link line and the second high-potential voltage link lines that overlap a data link line from the plurality of data link lines that is at an outer peripheral region of the substrate.

14. The display device of claim 3, wherein the plurality of holes are arranged differently in different regions on the first high-potential voltage link line and the second high-potential voltage link lines that overlap the plurality of data link lines.

15. The display device of claim 3, wherein a number of holes in the first high-potential voltage link line and the second high-potential voltage link line increases in a direction from a central portion of the substrate to an outer peripheral region of the substrate.

16. The display device of claim 3, wherein sizes of the plurality of holes in the first high-potential voltage link line and the second high-potential voltage link line increase in a direction from a central portion to an outer peripheral region of the substrate.

17. The display device of claim 1, wherein a length of the plurality of data link lines increases in a direction from a central portion of the substrate toward an outer peripheral region of the substrate.

18. The display device of claim 1, wherein the plurality of data link lines are on a different layer than the high-potential voltage link lines.

19. A display device comprising:

a substrate including a display area and a non-display area that at least partially surrounds the display area;

a plurality of pixels in the display area;

a data drive unit in the non-display area;

a plurality of data lines in the display area;

a plurality of data link lines in the non-display area, the plurality of data link lines electrically connecting together the data drive unit and the plurality of data lines; and high-potential voltage link lines in the non-display, the high-potential voltage link lines configured to supply high-potential voltages to the plurality of pixels, wherein an area of the high-potential voltage link lines that overlap the plurality of data link lines in the non-display area decreases in a direction from a center of the substrate towards an outer periphery of the substrate as a length of the plurality of data link lines increases from the center of the substrate to the outer periphery of the substrate.

20. The display device of claim 19, wherein the high-potential voltage link lines includes a plurality of holes in regions of the high-potential voltage link lines that overlap the plurality of data link lines.

21. The display device of claim 20, wherein a density of the plurality of holes in the high-potential voltage link lines increases from the center of the substrate towards the outer periphery of the substrate.

22. The display device of claim 21, wherein the plurality of holes have a same size.

23. The display device of claim 20, wherein a size of the plurality of holes in the high-potential voltage link lines increases from the center of the substrate towards the outer periphery of the substrate.

24. The display device of claim 23, wherein a density of the plurality of holes in the high-potential voltage link lines is a same across the high-potential voltage link lines.

25. A display device comprising:

a substrate including a display area and a non-display area that at least partially surrounds the display area;

a plurality of pixels in the display area;

a data drive unit in the non-display area;

a plurality of data lines in the display area;

a plurality of data link lines in the non-display area including a first data link line and a second data link line that is longer than the first data link line, the plurality of data link lines electrically connecting together the data drive unit and the plurality of data lines; and high-potential voltage link lines in the non-display, the high-potential voltage link lines configured to supply high-potential voltages to the plurality of pixels, wherein a first portion of the high-potential voltage link lines that overlap the first data link line has an area that is greater than an area of a second portion of the high-potential voltage link lines that overlap the second data link line that is longer than the first data link line.

26. The display device of claim 25, wherein the first portion of the high-potential voltage link lines includes a first plurality of holes and the second portion of the high-potential voltage link lines includes a second plurality of holes.

27. The display device of claim 26, wherein a density of the first plurality of holes in the first portion of the high-potential voltage link lines is less than a density of the second plurality of holes in the second portion of the high-potential voltage link lines.

28. The display device of claim 26, wherein a size of the first plurality of holes in the first portion of the high-potential voltage link lines is smaller than a size of the second plurality of holes in the second portion of the high-potential voltage link lines.

*   *   *   *   *